United States Patent
Enkisch et al.

(10) Patent No.: US 10,809,625 B2
(45) Date of Patent: Oct. 20, 2020

(54) INTENSITY ADAPTATION FILTER FOR EUV MICROLITHOGRAPHY, METHOD FOR PRODUCING SAME, AND ILLUMINATION SYSTEM HAVING A CORRESPONDING FILTER

(71) Applicant: Carl Zeiss SMT GmbH, Oberkochen (DE)

(72) Inventors: Hartmut Enkisch, Aalen (DE); Ulrich Mueller, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/432,303

(22) Filed: Jun. 5, 2019

(65) Prior Publication Data
US 2019/0285989 A1    Sep. 19, 2019

Related U.S. Application Data

(63) Continuation of application No. PCT/EP2017/081420, filed on Dec. 4, 2017.

(30) Foreign Application Priority Data

Dec. 5, 2016  (DE) .......................... 10 2016 224 113

(51) Int. Cl.
*G06F 7/20*    (2006.01)
*G03F 7/20*    (2006.01)
(Continued)

(52) U.S. Cl.
CPC ....... *G03F 7/70316* (2013.01); *G02B 5/0816* (2013.01); *G02B 5/0891* (2013.01); *G03F 7/70958* (2013.01); *G21K 1/062* (2013.01)

(58) Field of Classification Search
CPC .... G21K 1/062; G02B 5/0891; G02B 5/0816; G03F 7/70316; G03F 7/70958
See application file for complete search history.

(56) References Cited

U.S. PATENT DOCUMENTS

| | | | | |
|---|---|---|---|---|
| 2008/0204861 | A1* | 8/2008 | Shiraishi | G02B 5/0891 359/359 |
| 2009/0316737 | A1* | 12/2009 | Kasamatsu | H01S 3/08059 372/18 |

(Continued)

FOREIGN PATENT DOCUMENTS

| | | |
|---|---|---|
| DE | 102009044462 A1 | 1/2011 |
| DE | 102012209290 A1 | 3/2013 |

(Continued)

OTHER PUBLICATIONS

International Search Report, PCT/EP2017/081420, dated Jun. 14, 2018, 3 pages.

(Continued)

*Primary Examiner* — Steven Whitesell Gordon
(74) *Attorney, Agent, or Firm* — Edell, Shapiro & Finnan, LLC

(57) ABSTRACT

An optical element for an optical system that operates with working light in the wavelength spectrum of extreme ultraviolet light or soft X-ray radiation, in particular an optical system for EUV microlithography, that includes an absorber layer (12) for EUV or soft X-ray radiation. The absorber layer extends along an optically effective surface and has a thickness that is defined transversely with respect to the optically effective surface, wherein the thickness of the absorber layer varies over the optically effective surface. Also disclosed is a mirror formed by at least one roughened surface of the mirror, the roughness of which varies over the surface. In addition, an illumination system for an EUV (Continued)

projection exposure apparatus, and a method for producing a corresponding intensity adaptation filter are disclosed.

20 Claims, 10 Drawing Sheets

(51) Int. Cl.
*G02B 5/08* (2006.01)
*G21K 1/06* (2006.01)

(56) References Cited

U.S. PATENT DOCUMENTS

| | | | | |
|---|---|---|---|---|
| 2011/0228245 A1* | 9/2011 | Mann | ...................... | G21K 1/062 355/67 |
| 2012/0196208 A1* | 8/2012 | Mikami | .................. | B82Y 10/00 430/4 |
| 2012/0262688 A1* | 10/2012 | De Vries | ............. | G03F 7/70075 355/67 |
| 2013/0170056 A1* | 7/2013 | Ekstein | ................ | G02B 5/0808 359/838 |
| 2016/0154317 A1 | 6/2016 | Hermann | | |
| 2016/0225477 A1 | 8/2016 | Banine et al. | | |
| 2019/0137861 A1* | 5/2019 | De Groot | .................. | G03F 1/24 |

FOREIGN PATENT DOCUMENTS

| | | |
|---|---|---|
| EP | 1947682 A1 | 7/2008 |
| JP | 2011022012 A | 2/2011 |
| WO | 2011032813 A1 | 3/2011 |

OTHER PUBLICATIONS

International Preliminary Report on Patentability, PCT/EP2017/081420, dated Feb. 7, 2018, 14 pages.

Examination Report of Priority Application in German, 10 2016 224 113.3, dated Aug. 8, 2017, 5 pages.

* cited by examiner

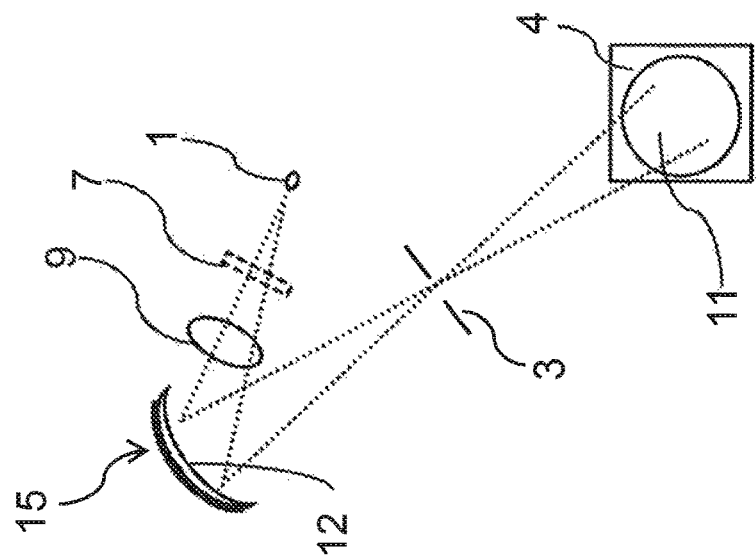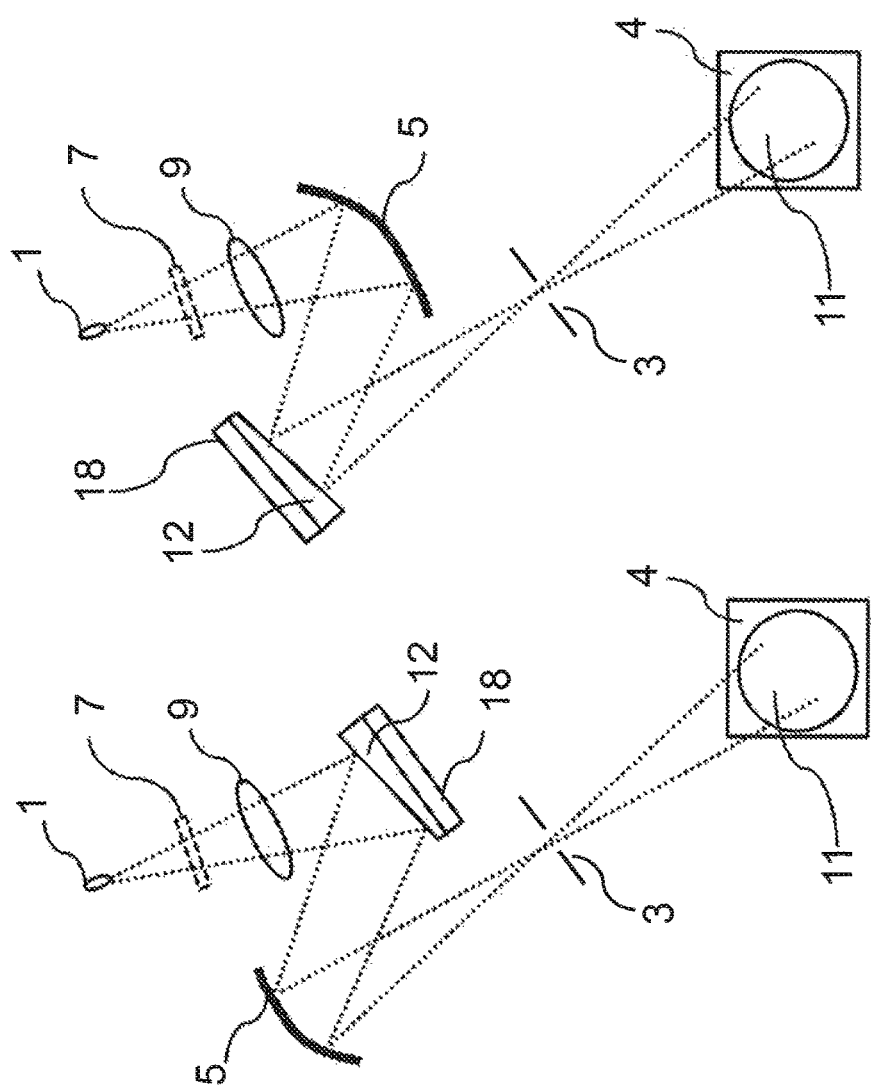
Fig. 8
Fig. 7
Fig. 6

INTENSITY ADAPTATION FILTER FOR EUV MICROLITHOGRAPHY, METHOD FOR PRODUCING SAME, AND ILLUMINATION SYSTEM HAVING A CORRESPONDING FILTER

CROSS REFERENCE TO RELATED APPLICATIONS

The present application is a continuation of International Application No. PCT/EP2017/081420, filed Dec. 4, 2017, which claims the priority under 35 U.S.C. § 119(a) of the German Patent Application DE 10 2016 224 113.3 filed on Dec. 5, 2016. The disclosures of both related applications are considered part of and are incorporated by reference into the disclosure of the present application in their respective entireties.

FIELD OF THE INVENTION

The present invention relates to an intensity adaptation filter for extreme ultraviolet (EUV) microlithography, and to an illumination system for an EUV projection exposure apparatus comprising an intensity adaptation filter, and to a method for producing an intensity adaptation filter and to the use of a corresponding intensity adaptation filter.

BACKGROUND

In order to produce micro- and nanostructured components appertaining to microelectronics and microsystems engineering, microlithographic projection exposure apparatuses are used, in which a reticle is illuminated by an illumination system and is imaged on a wafer by a projection lens, such that the structures contained on the reticle are imaged on the wafer in a reduced manner in order thus to form the corresponding structures on the wafer by way of lithographic processes. Since the structure sizes of the structures to be imaged are becoming smaller and smaller, the resolution capability of the projection exposure apparatuses must also be increased correspondingly. For this purpose, in projection exposure apparatuses, it is possible to use light having shorter and shorter wavelengths, for example in the range of the extreme ultraviolet (EUV) wavelength spectrum, having wavelengths of 5 nm to 15 nm, or in the range of soft X-ray radiation of 20 to 250 µm.

In order to be able to produce the small structures microlithographically, it must be ensured that the reticle is illuminated in a defined manner. Correspondingly, the working light provided by a light source has to be conditioned in the illumination system in order to have the required properties during the illumination of the reticle. By way of example, as homogeneous illumination of the reticle as possible is intended to be achieved with the illumination system, such that possible differences in intensity of the light provided by the light source must be compensated for in the reticle plane.

Furthermore, it is desirable to be able to exchange the light source of a projection exposure apparatus or parts thereof, such that options for adapting a then altered emission characteristic of a new light source to the illumination system are required. By way of example, if a different light source is used or a different collector mirror is employed, then besides an adaptation of the numerical aperture, this can also necessitate an adaptation of the far field intensities of the light source in the illumination system.

SUMMARY

Therefore, one object of the present invention is that of providing a possibility, in particular for EUV illumination systems for EUV projection exposure apparatuses, of being able to perform adaptations of the emission characteristic of a light source particularly with regard to the achievable intensity distribution of the light in the reticle plane, in order to be able to use preferably different light sources for the EUV illumination system. This applies in the same way to apparatuses that operate with working light in the wavelength spectrum of soft X-ray radiation. The adaptation of the emission characteristic to the desired illumination properties in particular with regard to the intensity distribution in the reticle plane or the compensation of the influence of difference light sources for illumination systems is intended, however, to be implementable in a simple manner with the least possible outlay and nevertheless to yield satisfactory results.

This object is addressed with an optical element having the features recited in the independent claims. Also addressing this object are an associated mirror having an intensity adaptation function as claimed, and a method for producing an intensity adaptation filter as claimed. Furthermore, the invention relates to an associated illumination system for an EUV projection exposure apparatus, and to a method for the use of an intensity adaptation filter as claimed.

The invention proposes, in order to compensate for differences in the light intensity and/or light intensity distribution of the working light, in particular EUV light, used in an illumination system for a microlithographic projection exposure apparatus, the use of an intensity adaptation filter, similar to a neutral filter or neutral density filter in the range of visible light, which enables an intensity adaptation by absorbing the working light used, specifically wavelength-independently in the wavelength range used. To that end, what is proposed is an optical element, in particular an intensity adaptation filter, comprising an absorber layer for the used working light, in particular EUV radiation, said absorber layer extending along an optically effective surface of the optical element and having a thickness that is defined transversely with respect to the optically effective surface. Said thickness of the absorber layer can be varied over the optically effective surface in order to compensate for different intensity distributions by different working light sources. In this case, optically effective surface is understood to mean that surface of the optical element or filter which is irradiated by working light or the light to be filtered.

The absorber layer can be applied on a substrate or the absorber layer can be embodied as self-supporting, particularly if the optical element is embodied as an intensity adaptation filter in the form of a transmission filter, that is to say that the working light to be filtered radiates through the optical element in the beam path of the illumination system.

The absorber layer, particularly in the case of the embodiment as a transmission filter, can comprise at least one partial layer having a reflection-reducing effect for one or more wavelengths of the working light.

The at least one reflection-reducing layer can be embodied differently along the layer such that the reflection-reducing effect is optimized depending on the local angle of incidence of the working light.

As an alternative to a transmission filter, the optical element can also be embodied as an intensity adaptation filter in the form of a reflective intensity adaptation filter, which reflects the working light in the beam path of the illumination system. Correspondingly, the substrate of the optical element or of the intensity adaptation filter, on which the absorber layer is applied, can be embodied as a mirror, in particular an EUV mirror.

The absorber layer can be embodied integrally or be composed of a plurality of partial layers, which can differ in particular with regard to the absorption effect. Since the absorber layer is intended to provide a different absorption effect in a manner distributed over the optically effective surface on which the working light is incident in the beam path of the illumination system, an advantageous adaptation of the different absorption effect can be realized by the use of a plurality of partial layers of the absorber layer. In this regard, by way of example, one partial layer can be formed from a material having a high absorption effect, while the other partial layer can be formed from a material having a low absorption effect. The setting of the thickness of the absorber layer for adapting the different absorption effect can then be carried out predominantly in the partial layer having a lower absorption effect, such that the accuracy of the thickness setting can be reduced. Correspondingly, the partial layer composed of a material having a low absorption effect can be embodied in particular at the surface of a corresponding optical element or intensity adaptation filter in order to be able to process the thickness contour of the superficial partial layer in a correspondingly simple manner, while a partial layer arranged underneath and having a higher absorption effect enables a basic setting of the absorption effect.

Furthermore, the embodiment of the absorber layer made from a plurality of partial layers can also be used to the effect that an absorber partial layer composed of a material which performs functions of a capping layer and is insensitive in particular vis à vis ambient influences and for example chemical reactions with hydrogen and oxygen is formed at the surface of the optical element or intensity adaptation filter. Furthermore, the material of a capping layer can also be chosen such that the surface is easy to clean.

The absorber layer can comprise molybdenum, ruthenium, silicon, $Si_3N_4$, ZrN, SiC, $B_4C$ and/or nickel.

The optical element or the intensity adaptation filter can have further functions, such as, for example, the function of a diffusor, wherein the corresponding diffusor effect can be realized by structuring the substrate of the optical element or intensity adaptation filter or applying a corresponding structuring layer. A structuring or structuring layer can be leveled again with a suitable smoothing layer in order to apply subsequent layers, for example the absorber layer.

In the case of the embodiment of the optical element or intensity adaptation filter as a reflective filter, the mirror function can be realized by a reflection layer in the form of a Bragg reflector having a multiplicity of alternately arranged layers of different refractive indices. The reflection layer, which like the absorber layer likewise extends along the optically effective surface, can be adapted to the different angles of incidence of the working light over the optically effective surface by virtue of the thickness ratios of the reflection layer or of the partial layers thereof being adapted in a suitable manner over the optically effective surface.

Furthermore, the bandwidth of wavelengths that can be reflected by the reflection layer can also be varied over the optically effective surface.

The surface of the absorber layer or a side facing an incidence side of the working light can have a microstructure or have a defined roughness. In the case of a structured surface or side of the absorber layer, the characteristic height of the microstructure can be greater than or equal to one quarter of the wavelength of the working light. In this case, characteristic height is understood to mean the maximum or mean distance between a maximum elevation and a minimum depression transversely with respect to the surface. In the case of a surface or side of the absorber layer that is provided with a defined roughness, the root-mean-squared roughness (RMS) of the surface can be greater than or equal to one quarter of the wavelength of the working light.

In the case of the embodiment of the optical element or intensity adaptation filter as a reflective intensity adaptation filter, the surface of the intensity adaptation filter at the incidence side of the working light can be embodied as rough enough to avoid interference with the standing wave field of the Bragg reflector. Correspondingly, the roughness, in particular the root-mean-squared roughness RMS, should be greater than one quarter of the wavelength of the working light. The same applies to the embodiment as a transmission filter, with the difference that here both outer surfaces toward the vacuum should have a roughness greater than one quarter of the wavelength.

According to a further aspect of the invention, for which protection is sought independently and in combination with other aspects of the invention, a mirror is proposed, into which the function of an intensity adaptation filter is integrated.

For this purpose, the mirror can comprise an absorber layer such as has already been described for a reflective intensity adaptation filter, wherein the absorber layer is deposited above the outermost layer of a reflection layer in the form of a Bragg reflector with a multiplicity of partial layers, or as an outermost layer of a Bragg reflector that is embodied with greater thickness.

If the absorber layer is formed by an outermost layer that is thicker than necessary for the Bragg reflection, the thickness of the outermost layer of the Bragg reflector can be determined by firstly determining that thickness of the outermost layer which is necessary for the maximum Bragg reflection, and then defining an additional thickness which is necessary for the required intensity adaptation, wherein the total thickness of the outermost layer is determined as a result.

For production, the outermost layer of the Bragg reflector can firstly be deposited with a thickness corresponding to the thickness for the maximum reduction of intensity of the reflected radiation that is intended to be achieved, wherein the thickness of the outermost layer of the Bragg reflector can then be reduced by material removal in the regions of the optical surface in which a smaller reduction of intensity of the reflected radiation is required. In this case, the material removal can be carried out in any suitable form using known methods. Alternatively, the thickness of the outermost layer of the Bragg reflector can be varied in a location-dependent manner by local deposition of additional material. The deposition of an additional absorber layer composed, in particular, of a material different than the outermost layer of the Bragg reflector can also be carried out in a location-dependent manner by local deposition in order to obtain a varying intensity adaptation over the optically effective surface. A location-dependent deposition of layers of varying thickness can be realized for example by molecular beam deposition with the aid of a Knudsen cell.

The integration of the intensity adaptation into a mirror can furthermore be achieved by the reflectivity of the mirror being reduced by the formation of a rough interface, wherein the roughness of the interface can be varied over the interface for the purpose of the locally varied intensity adaptation. This can be achieved for example by processing the surface using Ion Beam Figuring (IBF). However, other methods for roughening a surface can also be used. The interface can be a surface or an inner interface.

The roughened surface can be, in particular, that surface of a main body of the mirror on which the Bragg reflector is deposited, wherein, as a result of the direct deposition of the partial layers of the Bragg reflector on the roughened surface, the roughness of the roughened surface of the main body continues into the Bragg reflector and, as a result of a reduced reflectivity of the Bragg reflector, the intensity adaptation can be integrated into the mirror.

In a corresponding EUV illumination system which can be used for example as a measuring system with different light sources, the optical element or the intensity adaptation filter can be arranged between light source and a collector mirror or in the beam path proceeding from the light source downstream of a collector mirror or upstream and in the vicinity of a field facet mirror. The latter possibility applies only to an intensity adaptation filter embodied as a transmission filter. For a reflective intensity adaptation filter, there is furthermore the possibility of integrating it in the collector mirror.

The varying layer thicknesses of the absorber layer of an optical element or intensity adaptation filter can already be produced during production, that is to say during the deposition of the absorber layer, with corresponding deposition methods being correspondingly adapted. This can be done, for example, by virtue of the substrate on which the absorber layer is intended to be deposited being arranged in a suitable manner with respect to the coating source or being moved relative thereto, or by virtue of the provision of corresponding stops for shading in order to produce different layer thicknesses of the absorber layer.

Furthermore, the varying layer thickness of the absorber layer or the layer thickness distribution can also be realized by the subsequent processing of an absorber layer that has already been produced, for example by varying removal via Ion Beam Figuring (IBF).

The varying thicknesses of the absorber layer over the optically effective surface can be determined computationally and/or experimentally through iterative measurements.

BRIEF DESCRIPTION OF THE DRAWINGS

The accompanying drawings show purely schematically in

FIG. 6 an illustration of part of an illumination system of an EUV-projection exposure apparatus in accordance with a fourth embodiment of the present invention;

FIG. 7 an illustration of part of an illumination system of an EUV-projection exposure apparatus in accordance with a fifth embodiment of the present invention;

FIG. 8 an illustration of part of an illumination system of an EUV-projection exposure apparatus in accordance with a sixth embodiment of the present invention;

DETAILED DESCRIPTION

Further advantages, characteristics and features of the present invention will become clear from the following detailed description of exemplary embodiments with reference to the accompanying drawings. However, the invention is not limited to these exemplary embodiments. In particular, individual features and components, even if they are described in a functional or structural relationship with other features or components, are disclosed not only in these functional or structural relationships described, but also by themselves and in combination with all other features and/or components.

Figure 1:
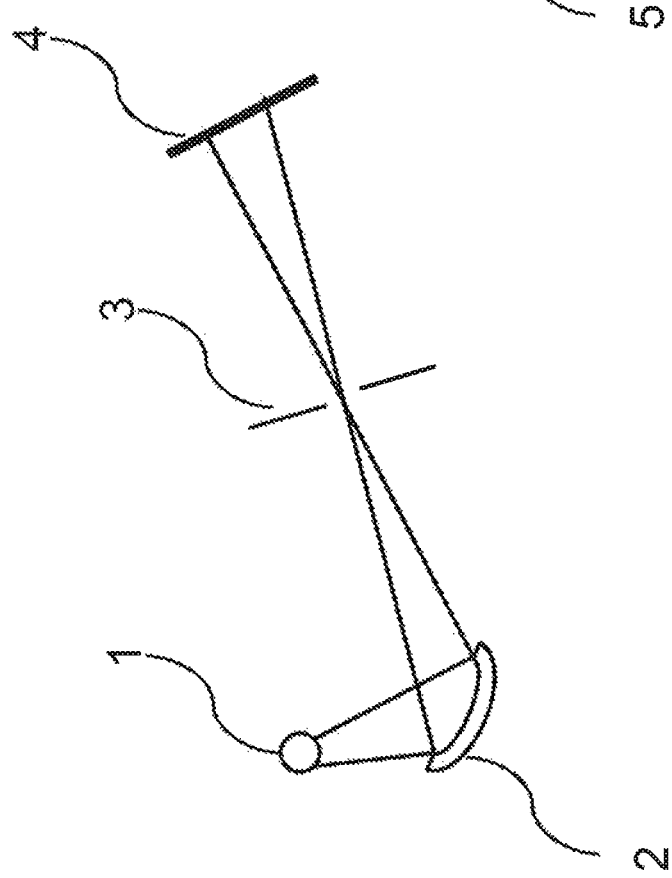
FIG. 1 part of a first illumination system for an EUV-projection exposure apparatus.

FIG. 1 shows part of a conventional illumination system for an EUV projection exposure apparatus comprising a plasma light source 1, which makes EUV light available, and an ellipsoidal mirror 2, which directs the EUV light from the plasma light source onto a field facet mirror 4. An intermediate focus is shown at 3.

Figure 2:
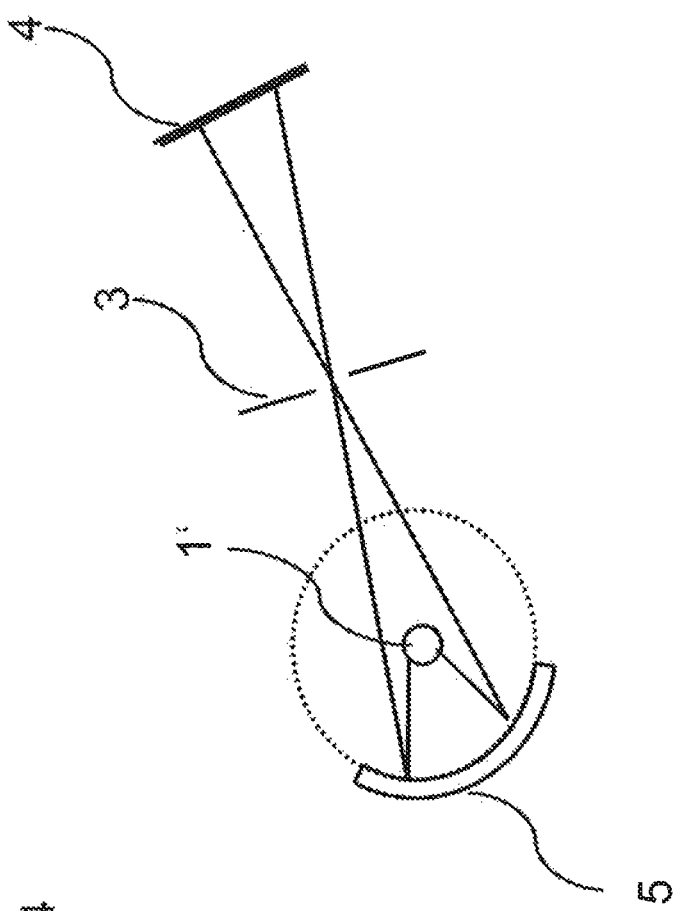
FIG. 2 part of an illumination system of a projection exposure apparatus in accordance with a second embodiment.

FIG. 2 shows part of a similar illumination system for an EUV projection exposure apparatus, wherein once again a plasma light source for EUV light and also a collector mirror 5 and a field facet mirror 4 are provided. Here, too, an intermediate focus exists at 3.

The illumination system in FIG. 2 differs from the illumination system in FIG. 1 in that a different EUV light source is used and in that, moreover, a collector mirror 5 is used, which is different than the ellipsoidal mirror 2. In addition, a cooling device for the plasma light source 1' is provided in the illumination system in FIG. 2.

The different configuration of the illumination systems comprising different plasma light sources 1, and different mirrors 2, 5 results in a different intensity distribution of the EUV light in the illumination system, which is intended to be compensated for by the use of an intensity adaptation filter in order to obtain comparable conditions in both illumination systems. By way of example, the illumination system in FIG. 1 can be a measuring system that is intended to be used to carry out EOS measurements, while the illumination system in FIG. 2 can be part of an illumination system which is in use in a projection exposure apparatus. In order to be able to transfer measurements at the measuring system in FIG. 1 to the illumination system in FIG. 2 and to avoid influences of different intensities and different intensity distributions, a corresponding intensity adaptation filter can be used. This is illustrated in FIGS. 3 to 8, which show different embodiments of illumination systems in which different intensity adaptation filters are used at different positions.

Figure 3:
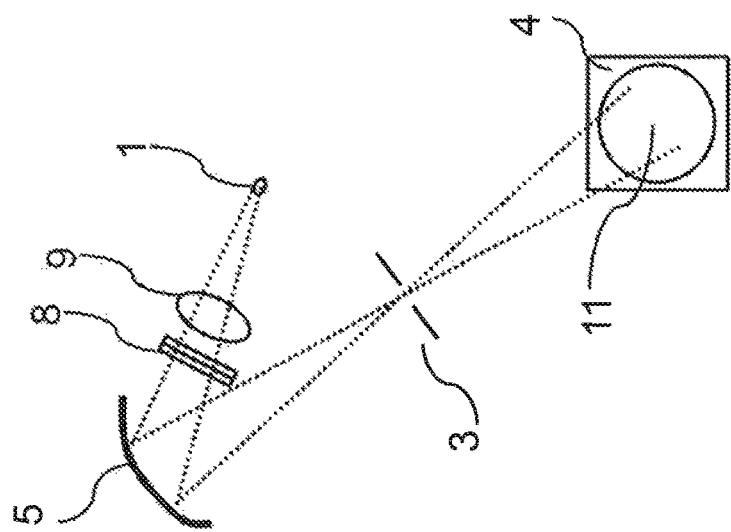
FIG. 3 part of an illumination system for an EUV projection exposure apparatus in accordance with a first embodiment of the present invention.

In this regard, FIG. 3 shows part of an illumination system comprising once again a plasma light source 1, a collector mirror 5, an intermediate focus 3 and a field facet mirror 4. The intensity adaptation filter 8 in the form of a filter through which radiation can be transmitted is provided in the region of the far field 10 arranged in the beam path downstream of the collector mirror 5, while a so-called debris filter 7 is arranged between plasma light source 1 and collector mirror 5, said debris filter filtering out contaminants that might pass from the plasma light source 1 into the beam path.

Figure 4:
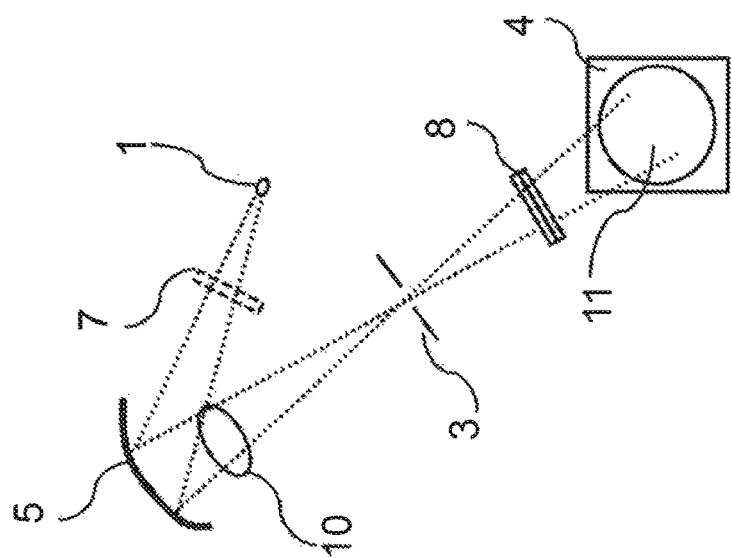
FIG. 4 an illustration of part of an illumination system for an EUV-projection exposure apparatus in accordance with a second embodiment of the present invention.

FIG. 4 shows substantially the same part of an identical illumination system in comparison with FIG. 3, but here the intensity adaptation filter 8, embodied once again in the form of a transmission filter, is arranged in the vicinity of the far field 11 at the field facet mirror 4.

Figure 5:
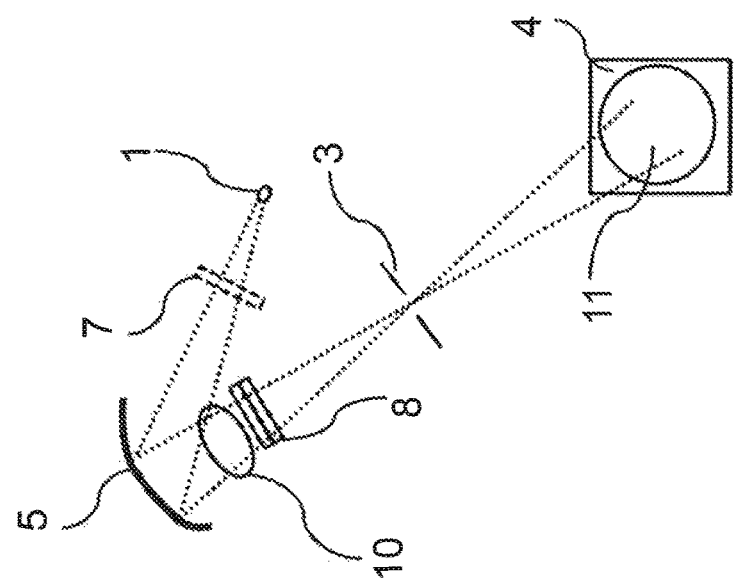
FIG. 5 an illustration of part of an illumination system of an EUV-projection exposure apparatus according to a third embodiment of the present invention.

A further possibility for the arrangement of the intensity adaptation filter 8 in an illumination system of an EUV projection exposure apparatus is shown in FIG. 5. Here the intensity adaptation filter 8 is arranged in the vicinity of the far field 9 of the plasma light source 1. The position of the intensity adaptation filter 8 in the case of the embodiment in FIG. 5 corresponds to the position of the arrangement of the debris filter 7 in the embodiments in FIGS. 3 and 4, such that preferably the intensity adaptation filter 8 additionally has the function of a debris filter, such that the functions of the debris filter 7 and of the intensity adaptation filter 8 can be integrated in a single filter. However, the intensity adaptation filter 8 can also be arranged without an additional debris filter function in the corresponding position in FIG. 5.

FIGS. 6 and 7 once again show parts of EUV illumination systems with the arrangement of intensity adaptation filters, but here the respective intensity adaptation filter 18 is not a transmission filter, as in the previous exemplary embodiments, wherein the light radiation thus passes through the filter, rather here it is a reflective intensity adaptation filter 18, in which the incident light radiation is reflected in a manner corresponding to a mirror. Correspondingly, the absorber layer 12 for forming the intensity adaptation filter is arranged on a plane mirror, as will be described in even greater detail below.

As can be gathered from FIGS. 6 and 7, the intensity adaptation filter 18 can likewise be arranged at different locations of an EUV illumination system. In the exemplary embodiment in FIG. 6, the intensity adaptation filter 18 is arranged between the plasma light source 1 and the collector mirror 5 in the vicinity of the far field 9 of the plasma light source 1, wherein a debris filter 7 is additionally provided between the intensity adaptation filter 18 and the plasma light source 1. For the rest, the embodiment in FIG. 6 does not differ from those embodiments in FIGS. 3 to 5.

In the case of the embodiment of the EUV illumination system as shown in FIG. 7, the difference with respect to the embodiment in FIG. 6 consists merely in the fact that the intensity adaptation filter 18 is arranged in the beam path downstream of the collector mirror 5.

FIG. 8 shows a further embodiment of an intensity adaptation filter 15. In this example, the intensity adaptation filter is combined with the collector mirror to form a component 15, wherein the absorber layer 12 for realizing the intensity adaptation is arranged on the collector mirror.

Although the integration of the function of intensity adaptation into components with other functions, such as debris filter or collector mirror, for example, is advantageous with regard to reducing the number of components, disadvantages also arise to the effect that production becomes more complex and correspondingly complex components having a plurality of functions have to be exchanged in the case of defective components. Correspondingly, it is necessary to weigh the achievable advantages against the attendant disadvantages.

Figure 9:
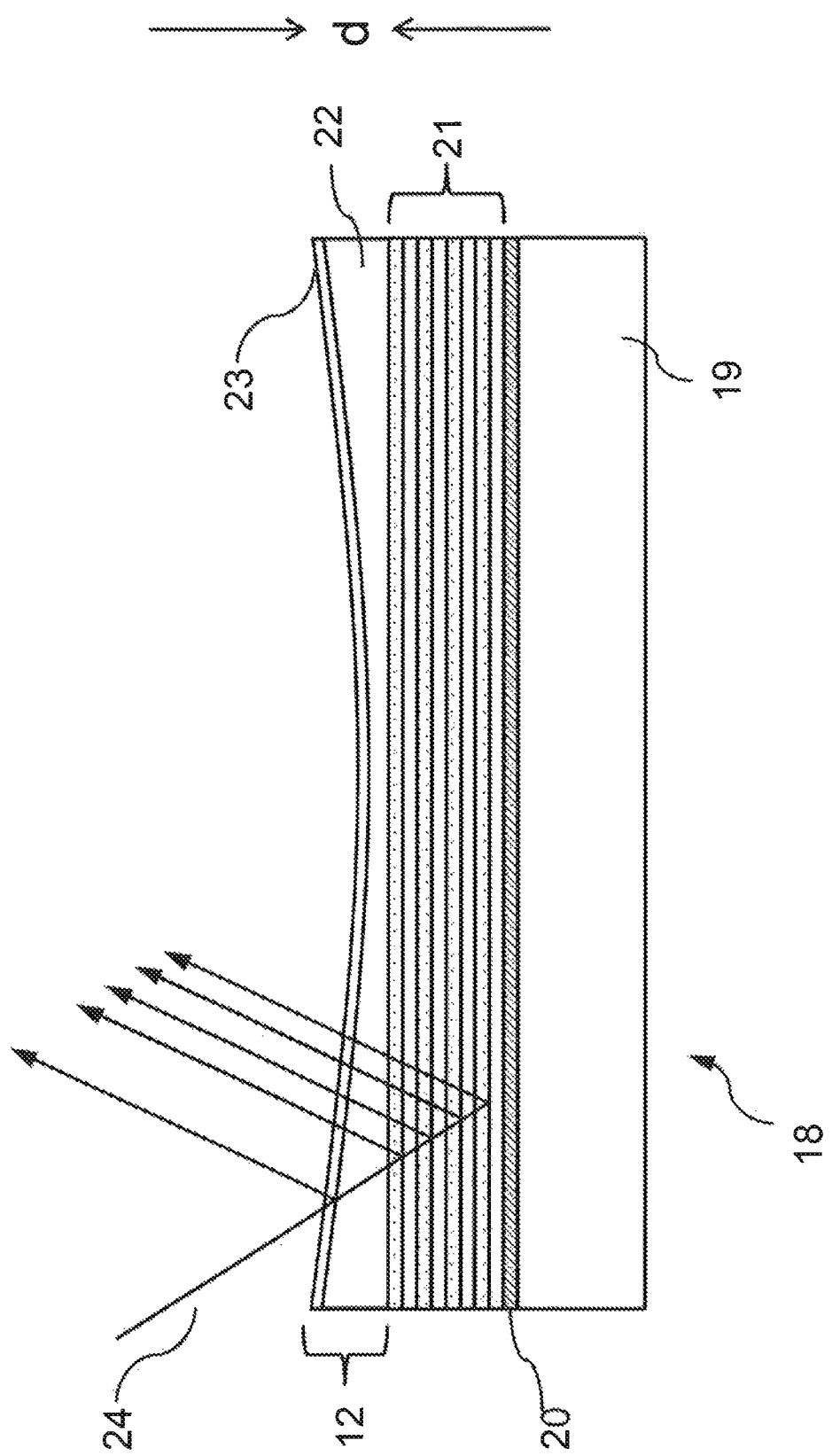
FIG. 9 a cross-sectional view of one embodiment of an intensity adaptation filter according to the present invention.

FIG. 9 shows an intensity adaptation filter 18 such as can be used in the embodiments in FIGS. 6 and 7. The intensity adaptation filter 18 is a reflective intensity adaptation filter, wherein the incident light radiation, that is to say the EUV light 24, is reflected at a reflection layer 21.

The intensity adaptation filter 18 accordingly comprises a substrate 19 embodied as a planar plate. A reflection layer in the form of a Bragg reflector 21 comprising alternating layers of different materials, such as molybdenum and silicon, for example, is to be provided on the substrate 19. As a result of the reflection of the incident light 24 at the partial layers of the reflection layer 21 and a suitable choice of the thickness of the partial layers, constructive interference of the reflected EUV light beams occurs. As a result of a corresponding choice of the number of layer pairs composed of molybdenum and silicon, or periods, a change in the layer thickness ratios in the Mo/Si layer system, the use of other materials or as a result of transition to higher harmonics of the multilayer system or as a result of an aperiodic vertical layer construction, so-called Z-grading, the bandwidth of the reflected light can be varied and the reflection layer can be of correspondingly narrowband or broadband design, such that only light in a narrow wavelength and angle-of-incidence range (narrowband) or in a large wavelength and angle-of-incidence range (broadband) is reflected. By varying the abovementioned parameters of the reflection layer 21 over the optically effective surface of the intensity adaptation filter, it is also possible to realize a variation of the bandwidth of the reflected radiation over the intensity adaptation filter.

A structuring layer 20 is provided below the reflection layer 21, said structuring layer providing structures that continue in the partial layers of the Bragg reflector during the deposition thereof, such that an effect as a diffusor for the incident light 24 is provided and the reflected intensity of the incident light is influenced as a result. The structures of the structuring layer 20 can be leveled by a smoothing layer on the outermost layer of the Bragg reflector in order to provide above the structuring layer 20 a smooth surface in particular for the subsequent absorber layer 12.

A bipartite absorber layer 12 comprising a lower partial layer 22 and a surface layer 23 is provided above the reflection layer 21 in the direction of the incident EUV light. The surface layer 23 differs with respect to the lower partial layer 22 in that it is embodied such that it can be cleaned of contaminations more easily and it is resistant to hydrogen and oxygen. Furthermore, with its absorption behavior, too, the surface layer 23 can be different vis à vis the lower partial layer 22 and bring about in particular a lower absorption of the EUV light.

As is evident from the illustration in FIG. 9, the absorber layer 12 has a varying layer thickness d defined transversely with respect to the surface in which the EUV light impinges on the intensity adaptation filter 18. The varying layer thickness d results in a varying absorption behavior over the optically effective surface of the intensity adaptation filter 18, such that it is possible to compensate for the intensity distribution for different components of the illumination system, such as different plasma light sources or collector mirrors.

Figure 10:
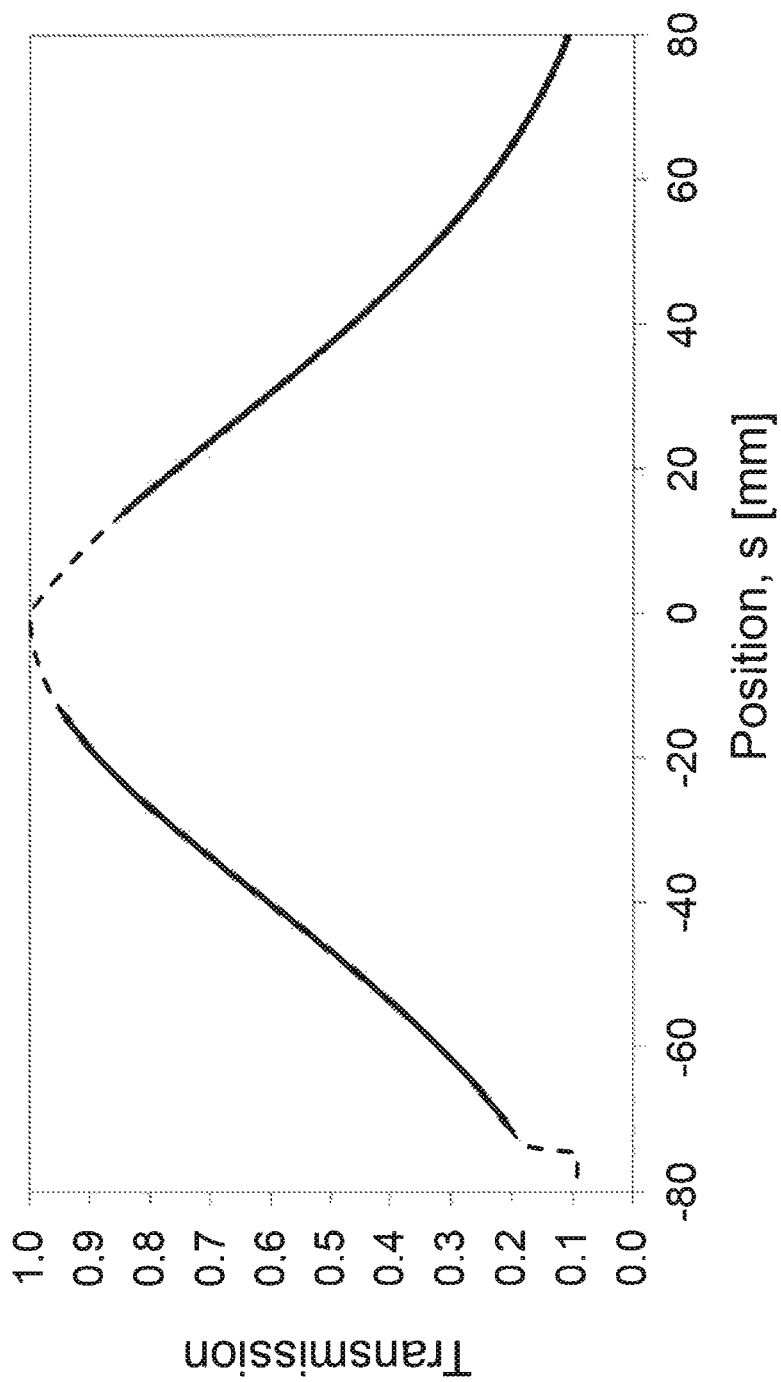
FIG. 10 a diagram illustrating the transmission of EUV radiation through a filter of the present invention along a line.

FIG. 10 shows one example of the transmission behavior of an absorber layer 12 along a line over the optically effective surface of the intensity adaptation filter 18, which can correspond to the sectional plane in FIG. 9. In the exemplary embodiment in FIG. 9, the optically effective surface of the intensity adaptation filter 18 extends transversely with respect to the image plane.

The transmission diagram in FIG. 10 shows that the absorber layer 12 of the exemplary embodiment in FIG. 9 enables almost 100% transmission in the center of the intensity adaptation filter 18, while the transmission is significantly reduced in the edge regions.

Figure 11:
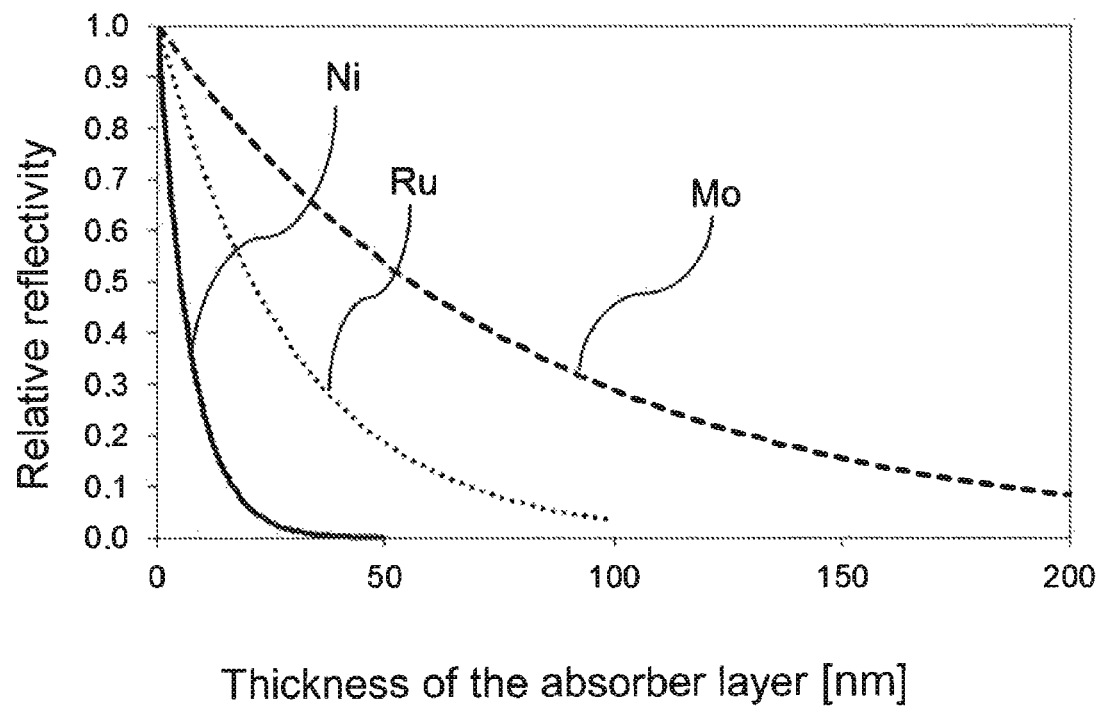
FIG. 11 a diagram showing the dependence of the relative reflectivity of an intensity adaptation filter in the form of a mirror element for various absorber materials.

FIG. 11 shows a diagram of the different absorption behavior of different materials as a function of the layer thickness d of the absorber layer. The diagram in FIG. 11 shows a relative reflectivity of, for example, the intensity adaptation filter 18 from FIG. 9 in the case of absorber layers of different thicknesses for the materials molybdenum, ruthenium and nickel. As is directly evident from the diagram in FIG. 11, nickel has the highest absorption for EUV light, while molybdenum has the lowest absorption for EUV light of the three materials considered.

Figure 12:
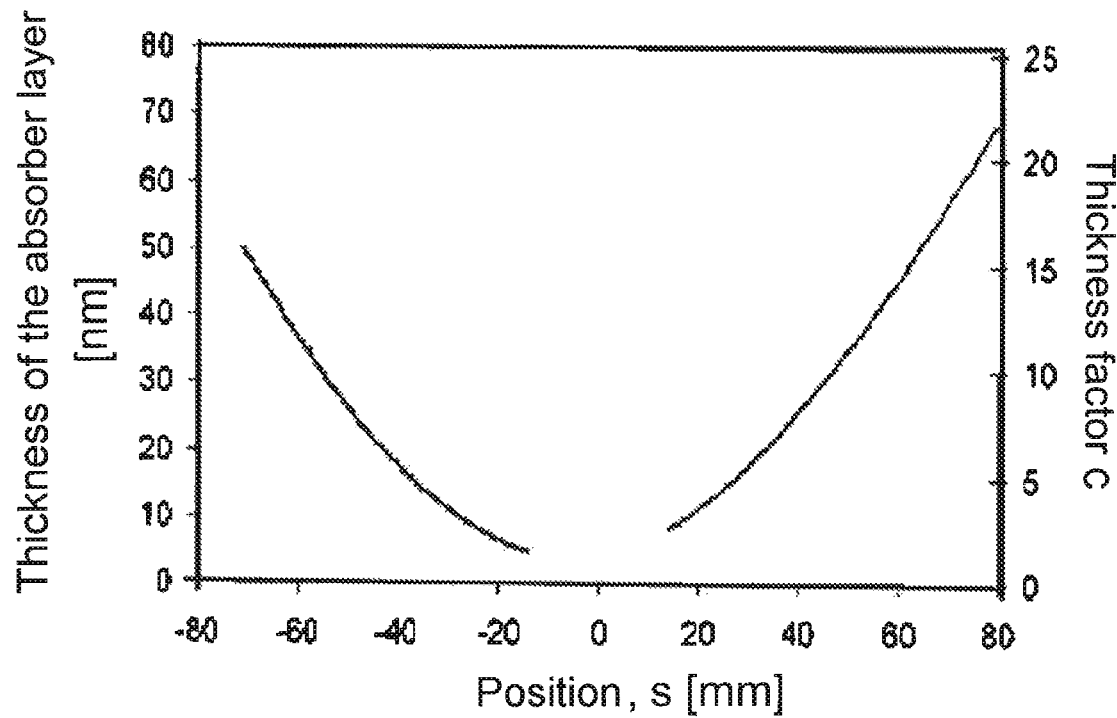
FIG. 12 a diagram showing the profile of the thickness of an absorber layer along a line over the filter and, respectively, the thickness factor (right-hand partial figure) of the corresponding absorber layer.

FIG. 12 shows, in the left curve relating to the left axis, the thickness of an absorber layer along a line over the optically effective surface of the intensity adaptation filter, while the right curve relating to the right axis shows the thickness factor c of a corresponding absorber layer along a line over the optically effective surface of the intensity adaptation filter 18 from FIG. 9. The thickness factor is defined here as the local thickness divided by the minimum thickness. The curves in FIG. 12 disclose the fact that, with ruthenium as absorber material, for example, layer thicknesses of the absorber layer of between 2-3 nm and 70 nm are required in order to produce the transmission profile shown in FIG. 10. This variation of the absolute thickness corresponds to a relative layer thickness change (thickness factor c) of up to 22. This shows that it is necessary to produce absorber layers with very different layer thicknesses. For this reason, it may be expedient to choose a bipartite or multipartite construction of the absorber layer 12, as shown in FIG. 9, in order, for example, already to ensure a high degree of the required absorption profile through a lower partial layer 22 having a strong absorption behavior, for example an absorber layer composed of nickel, and to enable a fine adjustment of the absorption profile with the further absorber partial layer having a lower absorptance 23. The lower the absorptance, the greater the thickness error that may be allowed for a required uncertainty of the transmission. This embodiment is therefore advantageous with regard to robustness vis à vis manufacturing fluctuations.

In order to produce the layer thickness profiles of the absorber layer, customary PVD methods (physical vapor deposition PVD) or molecular beam depositions can be used.

Additionally or alternatively, the absorber layer can also be set to the desired layer thickness profile after production by corresponding processing, for example by IBF (ion beam figuring) processing.

In the case of the configuration of the absorber layer 12 of the intensity adaptation filter 18 in accordance with the exemplary embodiment in FIG. 9 with a bipartite layer construction, the outer capping layer 23 can be formed from ruthenium, for example, which firstly brings about a lower absorption of the EUV light (see above) and secondly is insensitive vis à vis environmental influences. The lower absorption also affords the advantage that the requirements made of the accuracy of the layer thickness in the surface region are less stringent.

Figure 13:
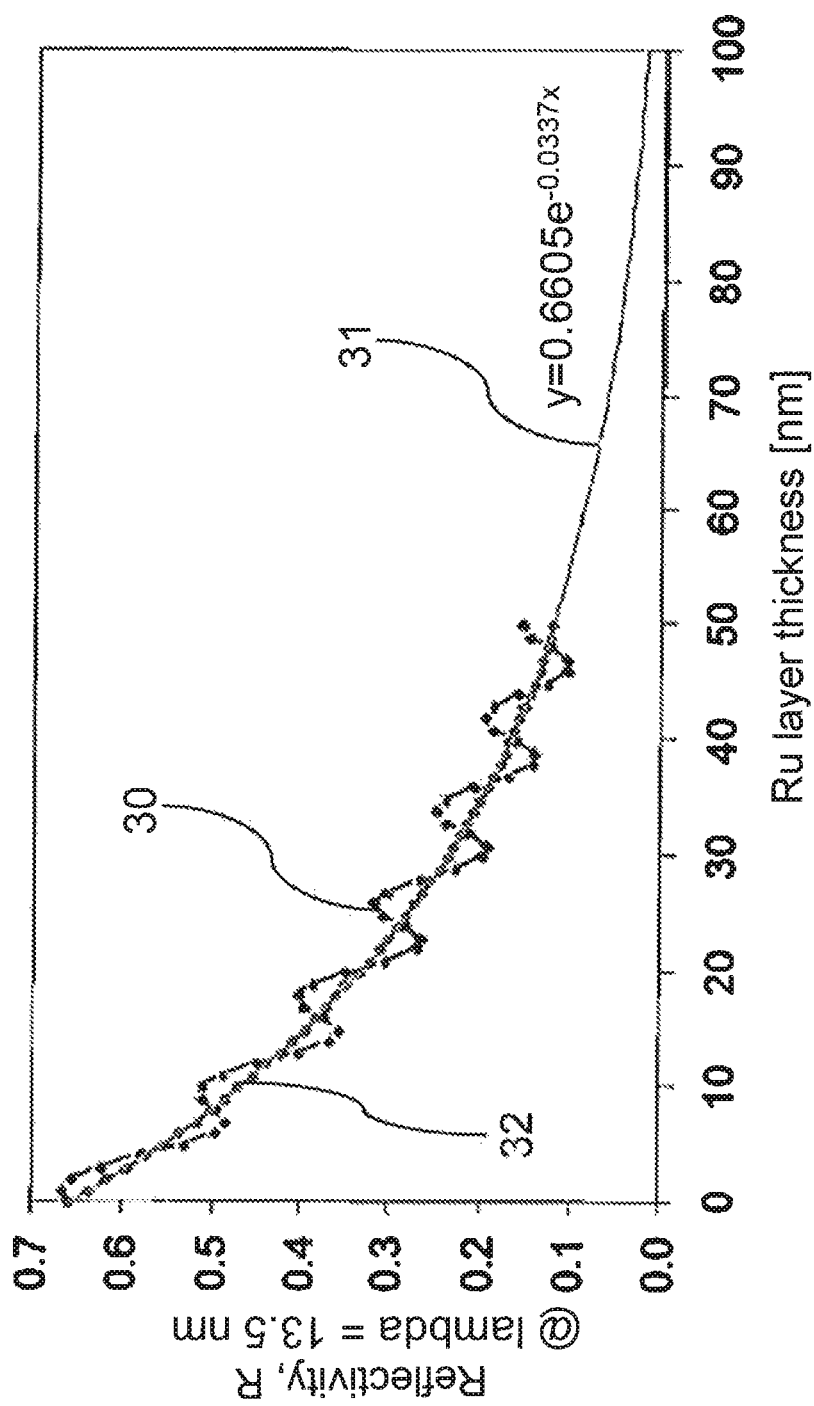
FIG. 13 a diagram showing the dependence of the reflectivity for a filter element according to the present invention on the basis of a mirror comprising a ruthenium absorber layer on the thickness in the case of various surface roughnesses.

Furthermore, with a corresponding capping layer 23, the surface roughness can also be set in the desired manner. As is evident from FIG. 13, in the case of the embodiment of the reflective intensity adaptation filter in the form of a plane mirror and in the case of excessively smooth surfaces, interference with the standing wave field of the reflection layer 21 can occur, such that with an increasing absorber layer the reflectivity would not decrease exponentially, but rather would oscillate around the exponential profile, as is shown in curve 30 for a surface roughness rms=0 nm in FIG. 13 (rms (root mean square) roughness). An almost exponential decrease in reflectivity with the layer thickness of the absorber layer, as shown in curve 31 in FIG. 13, thus results only if, as shown in curve 33, the surface roughness has a certain value, for example rms=3 nm.

Furthermore, an intensity adaptation filter 18 having a bipartite absorber layer 12 can be subjected to cleaning or subsequent processing more easily if the capping layer 23 is thick enough and/or can be renewed in a simple manner. Moreover, there is the possibility of adapting the transmission of the intensity adaptation filter to altered requirements more easily if, for example, an adaptation as a result of ageing of corresponding components, such as, for example, the EUV reflection layer on the collector mirror or the reflection layer of the intensity adaptation filter, necessitates an adaptation. In particular, it is also possible to compensate for layer thickness errors and reflectivity profiles on the collector mirror of an EUV illumination system with the neutral filter.

Figure 14:
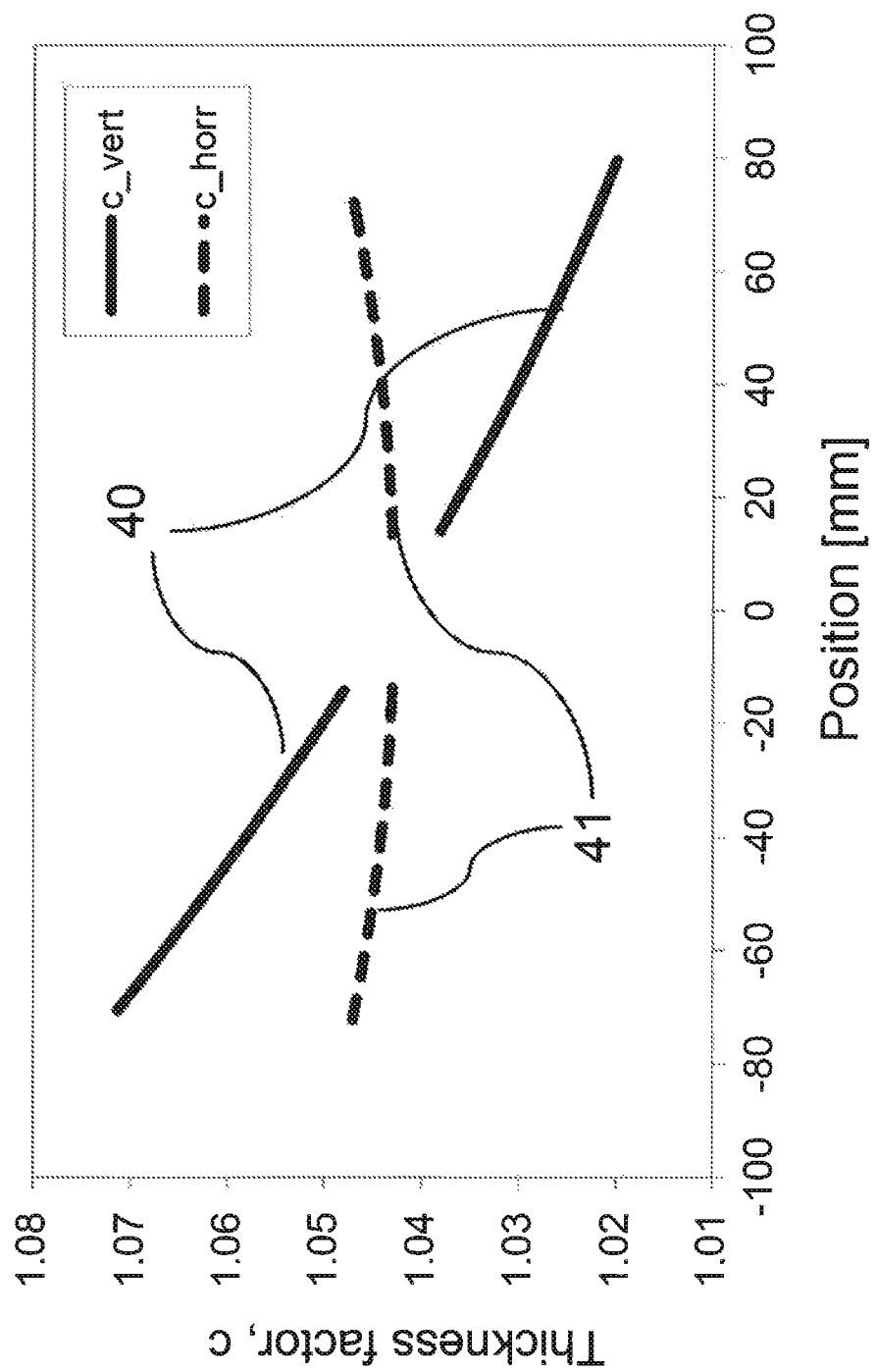
FIG. 14 a diagram showing the layer thickness variation along a line for a reflection layer of an intensity adaptation filter according to the invention.

FIG. 14 shows that the reflection layer can have layer thickness profiles on account of different angles of incidence of the incident light. The angles of incidence and the layer thickness profiles resulting therefrom can vary in different directions over the layer. Consequently, the relative layer thickness change or the thickness factor c also for the reflection layer over the optically effective surface is not equal to 1. The curves 40 and 41 of the diagram in FIG. 14 for a layer thickness factor referred to as vertical layer thickness factor c (curve 40) and a layer thickness factor referred to as horizontal layer thickness factor c (curve 41) show that different profiles of the thickness factor c in different directions over the mirror can result. The different layer thickness profiles over the mirror for the reflection layer 21 or the partial layers thereof can be obtained with resort to the corresponding coating methods in the same way as for the absorber layer.

Figures 15A, 15B:
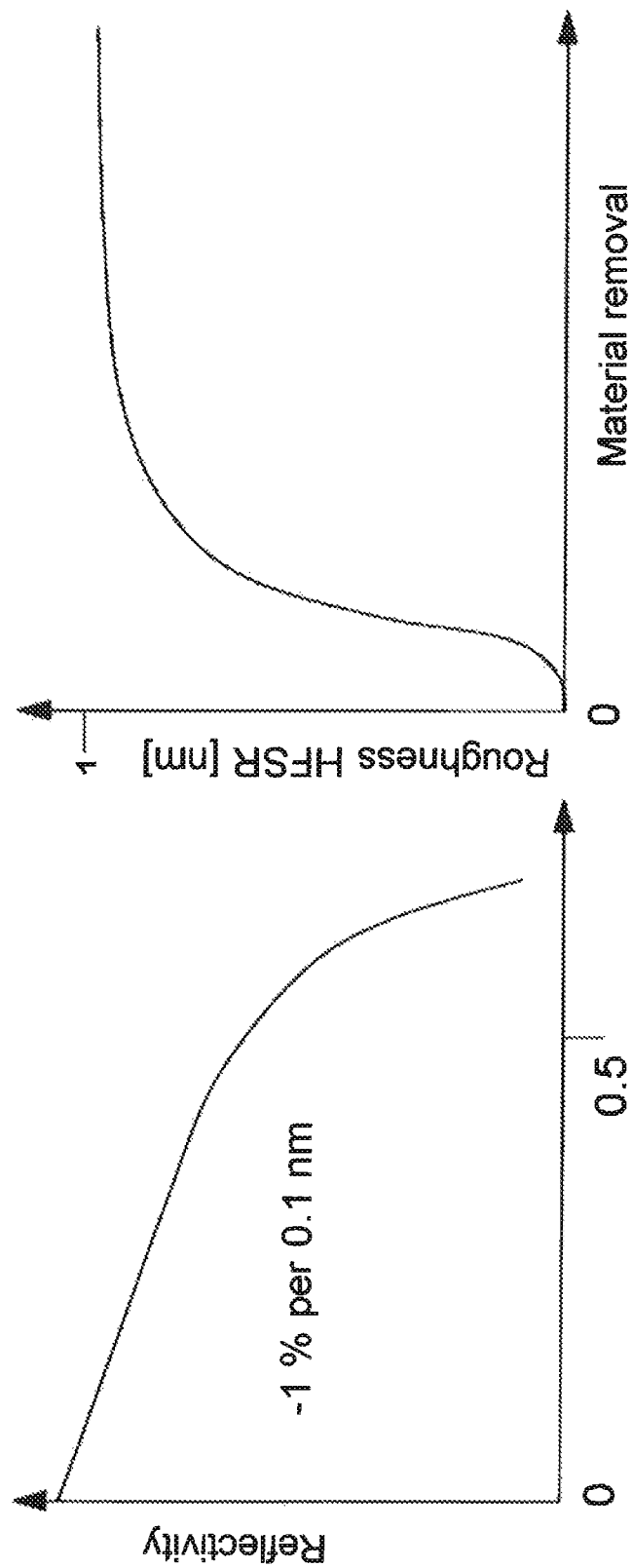
FIGS. 15A and 15B the dependence of the reflectivity on the roughness of the interface between substrate and Bragg reflector and the dependence of the roughness of a surface on the material removal using ion beam figuring; and in FIG. 16 a flow diagram for a method for producing an intensity adaptation filter according to the invention.

FIGS. 15A and 15B set out diagrams which show the dependence of the reflectivity on the roughness of the interface between substrate and Bragg reflector and the dependence of the roughness of a surface on the material removal using ion beam figuring.

Figure 16:
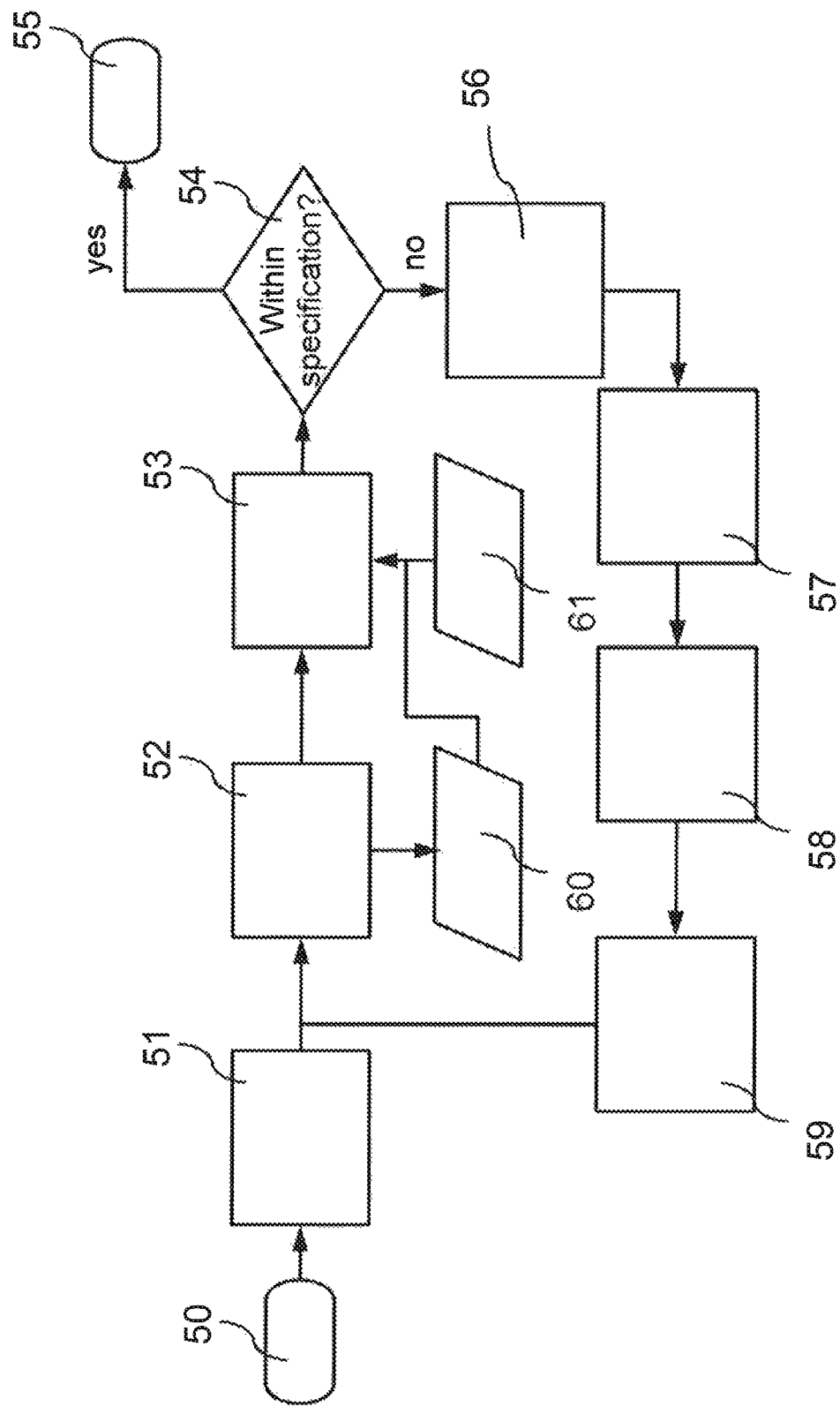

FIG. 16 shows the sequence of the production method for an intensity adaptation filter in a flow diagram. The reference sign 50 denotes the start and, in step 51, an intensity adaptation filter having a predetermined absorber layer is inserted into a corresponding measurement illumination system. Step 52 involves carrying out a corresponding measurement such as an EOS measurement, for example, wherein the detector in accordance with box 60 is arranged in a far field of the light source. Step 53 involves comparing the measurement result with a reference, wherein the reference values correspond to the far field of the reference source in accordance with box 61. If it is ascertained in step 54 that the measured value corresponds to the specification, the intensity adaptation filter can correspondingly be used and the method is ended in accordance with box 55.

However, if the intensity adaptation filter is not within the specification, step 56 involves calculating how the thickness of the absorber layer must be adapted. In step 57, the intensity adaptation filter is removed from the measurement illumination system and, in step 58, the thickness of the absorber layer is adapted by corresponding coating or by removal through IBF (ion beam figuring). In step 59, the intensity adaptation filter processed in this way is once again incorporated into the measurement illumination system in order once again to iterate the further method with step 52 and subsequent steps. The corresponding steps are repeated until, in step 54, a decision is taken that the intensity adaptation filter is within the specification.

Although the present invention has been described in detail on the basis of the exemplary embodiments, it is obvious to the person skilled in the art that this invention is not restricted to these exemplary embodiments, rather that modifications are possible in such a way that individual features are omitted or different combinations of features are realized, as long as there is no departure from the scope of protection of the appended claims.

The present disclosure includes all combinations of the individual features presented. In particular, the invention relates to subjects having the features or combinations of features set forth in the claims below, as well as equivalents thereof

What is claimed is:

1. An optical element for an optical system that operates with working light in a wavelength spectrum of extreme ultraviolet light or soft X-ray radiation, comprising:
   an absorber layer for extreme ultraviolet (EUV) or soft X-ray radiation extending along an optically effective surface and having a thickness that is defined transversely with respect to the optically effective surface,
   a reflection layer configured as a Bragg reflector and extending along the optically effective surface, wherein the Bragg reflector has a multiplicity of alternately arranged partial layers of different refractive indices, and
   a substrate onto which the reflection layer and the absorber layer are applied,
   wherein the optical element is embodied as a mirror,
   wherein the thickness of the absorber layer varies over the optically effective surface such that an intensity and/or an intensity distribution of the working light reflected by the mirror is adapted by absorption of the working light, and
   wherein layer thickness profiles of the partial layers in the reflection layer vary over the optically effective surface,
   whereby the variations in the layer thickness profiles of the partial layers in the reflection layer determine a bandwidth for the working light reflected by the mirror.

2. The optical element as claimed in claim 1, wherein the absorber layer is composed of a plurality of partial layers, which differ with regard to the absorption effect, and
   wherein at least a first of the absorber partial layers that faces an incidence side of the working light has a lower absorption than at least a second of the absorber partial layers that faces away from the incidence side of the working light.

3. The optical element as claimed in claim 1, further comprising a capping layer.

4. The optical element as claimed in claim 1, wherein the absorber layer comprises a capping layer.

5. The optical element as claimed in claim 1, wherein the absorber layer comprises at least one constituent selected from the group Mo, Ru, Si, $Si_3N_4$, ZrN, SiC, $B_4C$ and Ni.

6. The optical element as claimed in claim 1, wherein the substrate comprises a structuring layer configured as a diffusor.

7. The optical element as claimed in claim 1, wherein the substrate comprises a structuring layer and a smoothing layer.

8. The optical element as claimed in claim 1, wherein the reflection layer is configured to reflect the bandwidth of wavelengths that varies over the optically effective surface.

9. The optical element as claimed in claim 1, wherein the absorber layer has a microstructure at at least one side facing an incidence side of the working light and wherein a characteristic height of the microstructure is at least one quarter of the wavelength of the working light, for suppressing interference with a standing wave field.

10. The optical element as claimed in claim 1, wherein the absorber layer has a defined roughness at at least one side facing an incidence side of the working light and wherein the defined roughness is at least one quarter of the wavelength of the working light, for suppressing interference with a standing wave field.

11. The optical element as claimed in claim 1, wherein the absorber layer is fabricated from a material which is identical to or different than a material of an outermost layer of the Bragg reflector, and is arranged in addition to the outermost layer of the Bragg reflector on the outermost layer, and wherein a thickness of the outermost layer of the Bragg reflector is selected to produce a maximum reflectivity of the Bragg reflector.

12. A mirror for an illumination system that operates with working light, comprising:
   an intensity adaptation filter configured to vary an intensity of the working light reflected by the mirror over an optically effective surface,
   wherein the mirror is configured as the optical element as claimed in claim 1.

13. A mirror for an illumination system that operates with working light, comprising:
   an intensity adaptation filter configured to vary an intensity of the working light reflected by the mirror over an optically effective surface,
   wherein the mirror is configured as the optical element as claimed in claim 1, and
   wherein the optical element is formed by at least one roughened surface, the roughness of which varies over the optically effective surface such that an adaptation of an intensity and/or an intensity distribution of the working light reflected by the mirror is effected.

14. The mirror as claimed in claim 13, further comprising:
   a main body;
   the reflection layer configured as the Bragg reflector, wherein the reflection layer is arranged on the main body; and
   an interface between the main body and the reflection layer, wherein the interface is the roughened surface, and wherein the Bragg reflector is applied directly on the roughened surface.

15. An illumination system for an EUV projection exposure apparatus comprising:
  a light source that emits working light,
  a collector mirror,
  a field facet mirror, and
  an intensity adaptation filter configured as the optical element as claimed in claim 1,
  wherein the intensity adaptation filter is arranged in a structural unit with a mirror or as a mirror in a beam path proceeding from the light source between the light source and the collector mirror or downstream of the collector mirror or in a structural unit with the collector mirror, and
  wherein an adaptation of the intensity and/or an intensity distribution of the working light is effected with the intensity adaptation filter.

16. A method for producing an intensity adaptation filter, comprising:
  configuring the optical element as claimed in claim 1, wherein the absorber layer for the working light is produced such that the absorber layer extends along the optically effective surface and has a thickness that is defined transversely with respect to the optically effective surface,
  determining an absorber layer thickness that varies over the optically effective surface, and
  setting the varying thickness of the absorber layer during production of the absorber layer and/or adapting the thickness after the production of the absorber layer such that an adaptation of the intensity and/or an intensity distribution of the working light is effected by absorption of the working light.

17. The method as claimed in claim 16, wherein a thickness distribution of the absorber layer over the optically effective surface is ascertained with iterative measurements and comparisons with a reference and/or by calculation.

18. The optical element as claimed in claim 1, wherein the thickness ratios of the partial layers of the Bragg reflector over the optically effective surface are varied such that the thickness ratios of the partial layers include a layer thickness factor in a first direction and a layer thickness factor in a second direction, wherein the layer thickness factor in the first direction and the layer thickness factor in the second direction are different.

19. A mirror for an illumination system that operates with working light, comprising:
  a main body;
  a reflection layer configured as a Bragg reflector, wherein the Bragg reflector has a multiplicity of alternately arranged partial layers of different refractive indices;
  an interface between the main body and the reflection layer; and
  an intensity adaptation filter configured to vary an intensity of the working light reflected by the mirror over an optically effective surface,
  wherein the intensity adaptation filter is formed by at least one roughened surface, the roughness of which varies over the optically effective surface such that an adaptation of an intensity and/or an intensity distribution of the working light reflected by the mirror is effected,
  wherein the interface is the roughened surface,
  wherein the Bragg reflector is applied directly on the roughened surface, and
  wherein layer thickness profiles of the partial layers in the reflection layer vary over the optically effective surface,
  whereby the variations in the thickness in the layer thickness profiles of the partial layers in the reflection layer determine a bandwidth for the working light reflected by the mirror.

20. The mirror as claimed in claim 19, wherein the roughened surface has a root-mean-squared roughness of the surface greater than or equal to one quarter of a wavelength of the working light.

* * * * *

UNITED STATES PATENT AND TRADEMARK OFFICE
CERTIFICATE OF CORRECTION

PATENT NO. : 10,809,625 B2  
APPLICATION NO. : 16/432303  
DATED : October 20, 2020  
INVENTOR(S) : Enkisch et al.

Page 1 of 1

It is certified that error appears in the above-identified patent and that said Letters Patent is hereby corrected as shown below:

Column 11, Line 33, After "thereof" insert -- . --.

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*